United States Patent
Barndt et al.

(10) Patent No.: US 10,373,695 B2
(45) Date of Patent: Aug. 6, 2019

(54) METHODS AND APPARATUS FOR READ DISTURB DETECTION AND HANDLING

(71) Applicant: Western Digital Technologies, Inc., Irvine, CA (US)

(72) Inventors: Richard David Barndt, San Diego, CA (US); Aldo Giovanni Cometti, San Diego, CA (US); Haining Liu, Irvine, CA (US); Jerry Lo, Hacienda Heights, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 68 days.

(21) Appl. No.: 15/396,206

(22) Filed: Dec. 30, 2016

(65) Prior Publication Data

US 2018/0190362 A1 Jul. 5, 2018

(51) Int. Cl.
| | |
|---|---|
| *G06F 3/06* | (2006.01) |
| *G06F 11/10* | (2006.01) |
| *G11C 16/26* | (2006.01) |
| *G11C 16/34* | (2006.01) |
| *G11C 29/52* | (2006.01) |
| *G11C 29/00* | (2006.01) |

(52) U.S. Cl.
CPC .......... *G11C 16/3431* (2013.01); *G06F 3/064* (2013.01); *G06F 3/0619* (2013.01); *G06F 3/0647* (2013.01); *G06F 3/0679* (2013.01); *G06F 11/1068* (2013.01); *G11C 16/26* (2013.01); *G11C 16/3427* (2013.01); *G11C 29/52* (2013.01)

(58) Field of Classification Search
CPC ... G11C 16/3431; G11C 29/52; G06F 3/0619; G06F 3/064; G06F 3/0647; G06F 3/0679; G06F 11/1068; H03M 13/1105
See application file for complete search history.

(56) References Cited

U.S. PATENT DOCUMENTS

| | | | |
|---|---|---|---|
| 9,240,245 B1* | 1/2016 | Bellorado | .......... G11C 16/3422 |
| 2009/0228739 A1* | 9/2009 | Cohen | ................. G06F 11/1072 |
| | | | 714/6.12 |
| 2012/0233391 A1* | 9/2012 | Frost | ................... G06F 12/0246 |
| | | | 711/103 |
| 2013/0262749 A1* | 10/2013 | Oikawa | ................. G06F 11/004 |
| | | | 711/103 |

(Continued)

*Primary Examiner* — Guy J Lamarre
(74) *Attorney, Agent, or Firm* — Loza & Loza, LLP; Gabriel Fitch

(57) ABSTRACT

Aspects of the disclosure provide methods and apparatus for handling Read Disturb and block errors in a non-volatile memory (NVM) device. An error level of both an aggressor page that causes Read Disturb errors and an error level of adjacent victim pages are obtained. The error level of the victim page is compared against a predetermined threshold error level to determine if the victim page is experiencing a high level of bit errors. If so, then the error level of the aggressor page is compared to the error level of the victim page to determine whether Read Disturb errors are actually occurring due to host reads of the aggressor page. By looking at both the aggressor and victim error levels, a more accurate determination of Read Disturb errors may be obtained, resulting in less unnecessary relocations of pages and blocks within an NVM for mitigating Read Disturb effects.

23 Claims, 5 Drawing Sheets

(56) References Cited

U.S. PATENT DOCUMENTS

2014/0115419 A1* 4/2014 Ahn ................... G06F 11/1048
   714/758
2017/0139761 A1* 5/2017 Song ................... G06F 11/079

* cited by examiner

| Aggressor Stage / Victim Stage | 1 | 2 | 3 | 4 |
|---|---|---|---|---|
| 1 | - | Move Aggressor LBA | Move Aggressor PageSet | Move Block Set |
| 2 | - | Move Aggressor LBA | Move Aggressor PageSet | Move Block Set |
| 3 | Move Victim WLSet | Move Aggressor LBA Move Victim WLSet | Move Aggressor PageSet Move Victim WLSet | Move Block Set |
| 4 | Move Block Set | Move Block Set | Move Block Set | Move Block Set |

METHODS AND APPARATUS FOR READ DISTURB DETECTION AND HANDLING

FIELD

The present disclosure relates generally to solid state drives (SSDs), and more specifically, to methods and apparatus for Read Disturb detection and handling.

BACKGROUND

In a variety of consumer electronics, solid state drives (SSDs) incorporating non-volatile memories (NVMs) are frequently replacing or supplementing conventional rotating hard disk drives for mass storage. These non-volatile memories may include one or more flash memory devices, such as NAND flash memories, and the flash memory devices may be logically divided into blocks with each of the blocks further logically divided into addressable pages. These addressable pages may be any of a variety of sizes (e.g., 512 Bytes, 1 Kilobytes, 2 Kilobytes, 4 Kilobytes), which may or may not match the logical block address sizes used by a host computing device.

When cells or pages in a block are read from an NVM, the process of reading a page may have a detrimental effect on other pages in the block. The method used to read flash memory can cause surrounding pages in the same memory block to change over time (i.e., become programmed). The read page does not fail, but instead the surrounding pages may fail on a subsequent read. This phenomenon is known as the Read Disturb effect. Read Disturb induced errors typically occur when a wordline (WL) of a NVM is read substantially more frequently than other wordlines on the same block. In particular, the immediately adjacent wordlines are the most prone to errors and show large numbers of errors after enough Read Disturb activity has occurred. The Read Disturb errors can cause possible data loss if the errors are too numerous to correct with error-correcting codes (ECCs). Accordingly, when a Read Disturb issue occurs, there is effectively a Read Disturb source or "Aggressor" causing the Read Disturb and a Read Disturb "Victim" that is affected by the source.

In order to handle or mitigate Read Disturb errors, known methods include directly keeping read counts for every block in an NVM. For example, when a certain threshold for access counts of a block is reached, the data of the entire block is then relocated in the NVM. This method, however, is inefficient as the entire block is relocated when the threshold read count is reached and is performed without regard to the actual error rates.

Other known mechanisms for handling Read Disturb include performing periodic Background Media Scanning (BGMS) of the entire NVM to figure out which blocks in the NVM have higher numbers of ECC errors. This methodology, however, can take a very long time before a location is actually scanned. Thus, due to this delay, data affected by Read Disturb may become uncorrectable and force Redundant Array of Independent Disks (RAID) recoveries or other mechanisms to recover the data.

Accordingly, it would be beneficial to more accurately identify sources of Read Disturb errors to be able to perform relocation of data only when necessary.

SUMMARY

According to an aspect, a method of determining Read Disturb errors in a non-volatile memory (NVM) is disclosed. The method includes determining a first error level of a first page in a block of the NVM and a second error level of at least one adjacent page having a wordline adjacent to a wordline of the first page occurring over a predetermined number of read accesses of the first page. Additionally, the method includes determining whether the second error level of the at least one adjacent page is above a first predetermined threshold, and then comparing the first error level to the second error level when the second error level is above the first predetermined threshold to determine whether the second error level is greater than the first error level by a predefined factor. A Read Disturb error is then determined when the second error level is greater than the first error level by the predefined factor.

According to another aspect, a solid state drive (SSD) is disclosed that includes a non-volatile memory (NVM) and a controller communicatively coupled to a host device and the NVM. The controller is configured to determine an error level of an aggressor page in the NVM. Further, the controller determines an error level of a victim page adjacent to the aggressor page within a block of the NVM, and whether the error level of the victim page is greater than a first predetermined threshold. Additionally, the controller compares the error level of the aggressor page to the error level of the victim page when the error level of the victim is greater than the first predetermined threshold. The controller then determines a Read Disturb error of the victim page when the comparison of the error levels of the aggressor and victim pages indicates that victim level error is greater than the first error level by a predefined factor.

According to yet another aspect, a memory device including an apparatus for handling Read Disturb and block errors in a non-volatile memory (NVM) is disclosed. The apparatus includes means for determining whether a number of read accesses of a page in the NVM has reached a predefined value. Further, the apparatus includes means for obtaining an error measure for the page after the number of read accesses has reached the predefined value, as well as means for obtaining an error measure for at least one neighboring page that is on an adjacent wordline to the page within the NVM. The apparatus also includes means for determining if the error measure of the at least one neighboring page is greater than a predefined threshold. Finally, the apparatus includes means for determining a Read Disturb error of the at least one neighboring page when the error measure of the at least one neighboring page is greater than the error measure of the page by a predefined factor.

BRIEF DESCRIPTION OF THE DRAWINGS

FIG. 4 is a diagram illustrating a decision matrix for Read Disturb and block error handling in accordance with embodiments of the present disclosure.

DETAILED DESCRIPTION

Figure 1:
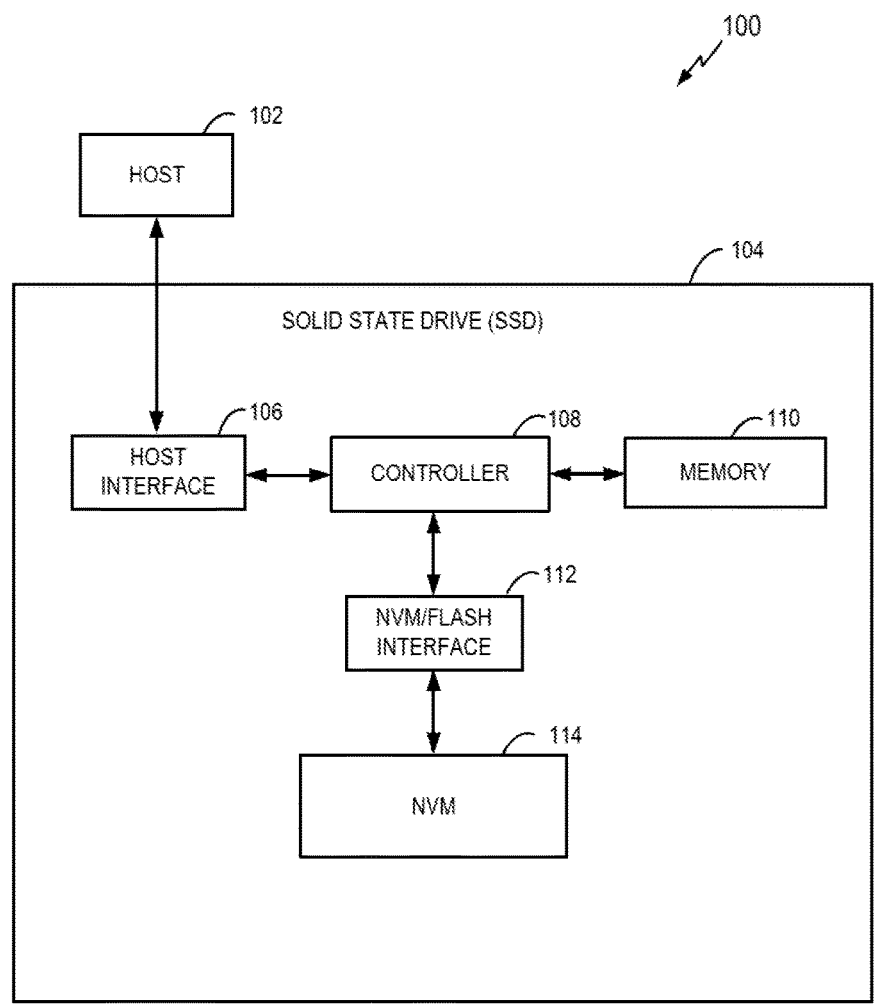
FIG. 1 is a block diagram of an exemplary solid state device (SSD) in which detection of potential Read Disturb errors and triggering of block relocation may be performed in accordance with embodiments of the present disclosure.

The present disclosure provides methods and apparatus for more accurately determining whether a page or a block is a potential Read Disturb source so that relocation of blocks is more likely performed only when necessary. Based on an active detection of potential Read Disturb sources or aggressors, an exact NVM address can be provided. By directly reading the surrounding potential victims, an ECC error count for the victims can be obtained. If the ECC error count is high enough, the present methods and apparatus provide for relocation of just those pages that are affected (e.g., the pages that have high enough errors). In this way, only part of the block has to be relocated, and the appropriate data is relocated. Additionally, there is no need to wait for other processes to relocate data, which may result in data loss such was described above in connection with a passive BGMS scan, for example. The presently disclosed active process of scanning the surrounding pages can be used to prevent Read Disturb issues from getting out of hand. Furthermore, the presently disclosed method and apparatus provide for reading of the actual potentially affected pages and executing an error-handling process to determine the degree of severity of errors. By determining how bad the error level is for pages, this error level is then further compared to a predefined scale to determine if the page is indeed a victim of read disturb errors.

Referring to the drawings, apparatus and methods for triggering a Read Disturb protocol is illustrated, where the protocol is the process of determining potential detrimental Read Disturb errors in a block and then relocating the block in the NVM. In contrast to related art the presently disclosed methods and apparatus described herein that consider logical block addresses (LBAs) helps ensure that the Read Disturb detection is performed on the host access pattern and that preventative measures are taken. Furthermore, the write amplification will be significantly reduced.

FIG. 1 is a block diagram of a system 100 including an exemplary solid state device (SSD) in which the disclosed detection and relocation of Read Disturb blocks may be implemented in accordance with aspects of the disclosure. The system 100 includes a host 102 and a SSD storage device 104 coupled to the host 102. The host 102 provides commands to the SSD storage device 104 for transferring data between the host 102 and the SSD storage device 104. For example, the host 102 may provide a write command to the SSD storage device 104 for writing data to the SSD storage device 104 or read command to the SSD storage device 104 for reading data from the SSD storage device 104. The host 102 may be any system or device having a need for data storage or retrieval and a compatible interface for communicating with the SSD storage device 104. For example, the host 102 may a computing device, a personal computer, a portable computer, a workstation, a server, a personal digital assistant, a digital camera, or a digital phone as merely a few examples.

The SSD storage device 104 includes a host interface 106, a controller 108 (which may also include a cache manager (CM) in some embodiments), a memory 110, a non-volatile memory (NVM) interface 112 (which may also be referred to as a Flash memory interface), and a non-volatile memory (NVM) 114, such as a NAND Flash memory for example. The host interface 106 is coupled to the controller 108 and facilitates communication between the host 102 and the controller 108. Additionally, the controller 108 is coupled to the memory 110 and the NVM 114 through the NVM interface 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host 102 includes the SSD storage device 104. In other embodiments, the SSD storage device 104 is remote with respect to the host 102 or is contained in a remote computing system communicatively coupled with the host 102. For example, the host 102 may communicate with the SSD storage device 104 through a wireless communication link.

The controller 108 controls operation of the SSD storage device 104. In various aspects, the controller 108 receives commands from the host 102 through the host interface 106 and performs the commands to transfer data between the host 102 and the NVM 114. Furthermore, the controller 108 may manage reading from and writing to memory 110 for performing the various functions effected by the controller and to maintain and manage cached information stored in memory 110.

The controller 108 may include any type of processing device, such as a microprocessor, a microcontroller, an embedded controller, a logic circuit, software, firmware, or the like, for controlling operation of the SSD storage device 104. In some aspects, some or all of the functions described herein as being performed by the controller 108 may instead be performed by another element of the SSD storage device 104. For example, the SSD storage device 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The memory 110 may be any memory, computing device, or system capable of storing data. For example, the memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 108 uses the memory 110, or a portion thereof, to store data during the transfer of data between the host 102 and the NVM 114. For example, the memory 110 or a portion of the memory 110 may be a cache memory.

The NVM 114 receives data from the controller 108 via the NVM interface 112 and stores the data. The NVM 114 may be any type of non-volatile memory, such as a flash storage system, a NAND-type flash memory, a solid state drive, a flash memory card, a secure digital (SD) card, a universal serial bus (USB) memory device, a CompactFlash card, a SmartMedia device, a flash storage array, or the like.

In the example of FIG. 1, read requests will generally comprise a request from the host 102 via the interface 106 to read the data within a given logical Page address associated with the NVM 114. Each logical Page address is associated with a specific physical address within the NVM 114 through the use of a table maintained by the system controller 108. In general, the table maps each logical Page address to a physical Page address within the NVM 114. The use of logical Page addresses and a logical-to-physical Page address conversion allows the controller 108 to effectively manage the memory within the NVM 114 and to implement various mapping and detection mechanisms, including the disclosed mechanism for detecting Read Disturb errors.

Figure 2:
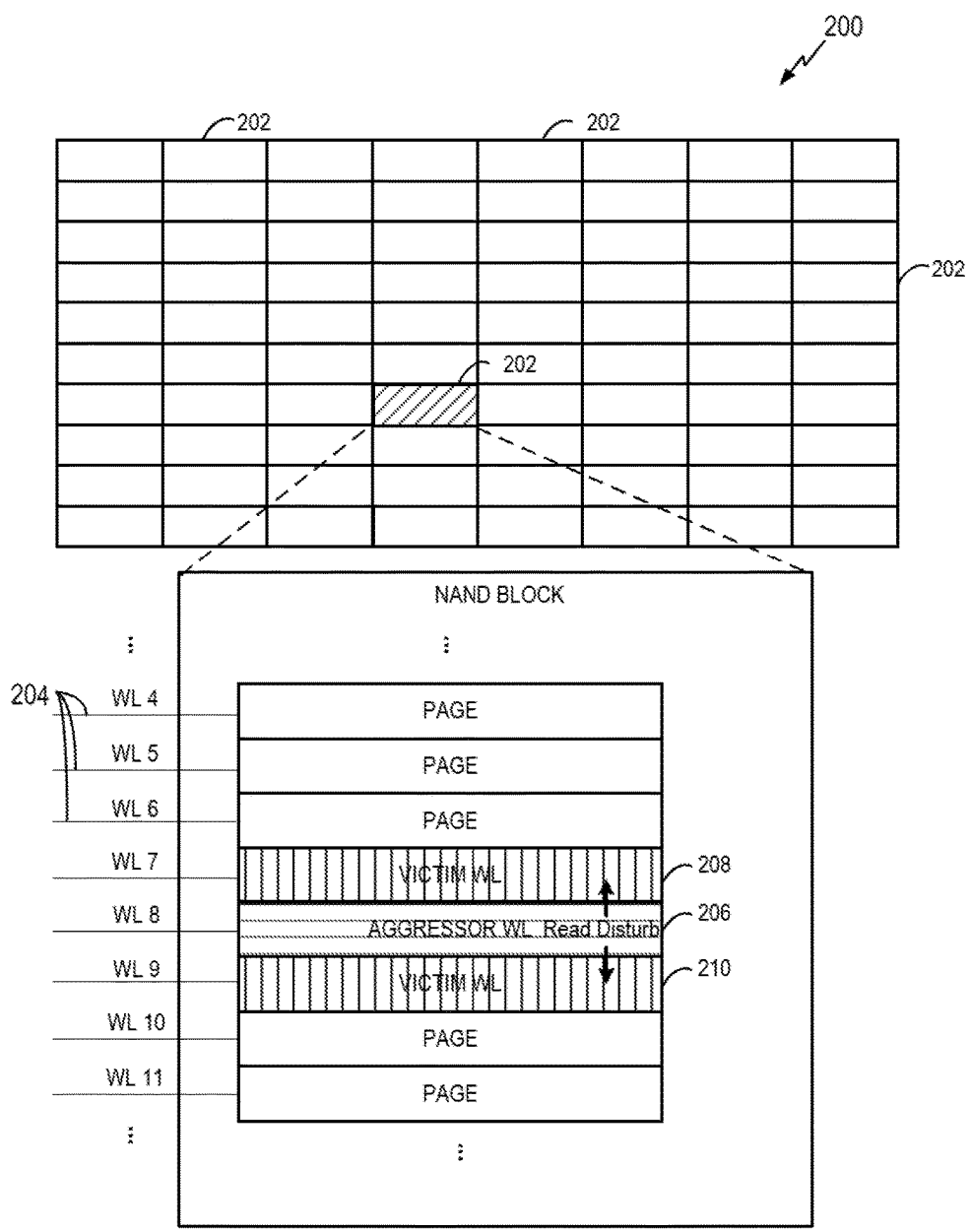
FIG. 2 is a diagram illustrating an exemplary flash memory array organization.

FIG. 2 is a block diagram illustrating an exemplary flash memory organization. A flash memory array structure 200 may include a number of memory blocks 202 (hereinafter "blocks" in this disclosure). Each block 202 may include a number of pages. Access to the pages may be controlled via an "n" number of wordlines 210 (e.g., WL0 through WLn, although only WL4 through WL11 are specifically shown in the example of FIG. 2 for clarity and brevity of illustration). In the illustrated example, a wordline (WL) controls the access of a single page.

In an aspect, the pages and wordlines may be addressed using a most significant bit (MSB) and least significant bit (LSB) in the example of a multi-level cell (MLC) NAND construction (i.e., a 2 bit per cell construction also known as MSB and LSB). In one example, the LSB and MSB addresses for a page may be determined based on the wordline number within a block (e.g., 8 for WL 8) according the relationships LSB address=(WL×2)−1 and MSB address=LSB+3. Thus, for example, for wordline WL 8, the LSB address is 15 and the MSB address is 18. Additionally, for the first and last wordlines in a block (e.g., WL 0 and WL n), the relationship to determine the LSB and MSB addresses may be the LSB address=(WL×2)−1 and MSB address=LSB+2. It is further noted that such addressing is merely exemplary, and other addressing schemes may also be used in the presently disclosed methods and apparatus. For instance, other examples of constructions of NVM devices contemplated for use with the disclosed methods and apparatus, constructions may include 1 bit per cell, 3 bit per cell (e.g., triple level cells (TLC)), and 4 bits per cell.

The present methods and apparatus provide for detection of a particular aggressor page, such as page 206 shown in FIG. 2. Frequent read access of those pages determined to be aggressor pages will more likely cause Read Disturb errors in other pages controlled by adjacent or neighboring wordlines, such as victim pages 208 and 210. While FIG. 2 illustrates an exemplary memory organization of the flash memory 200, the present disclosure is not limited to this particular example. In other examples, the flash memory 200 may have other memory organizations. The flash memory 200 may be included in the NVM 114 of the SSD 104.

Figure 3:
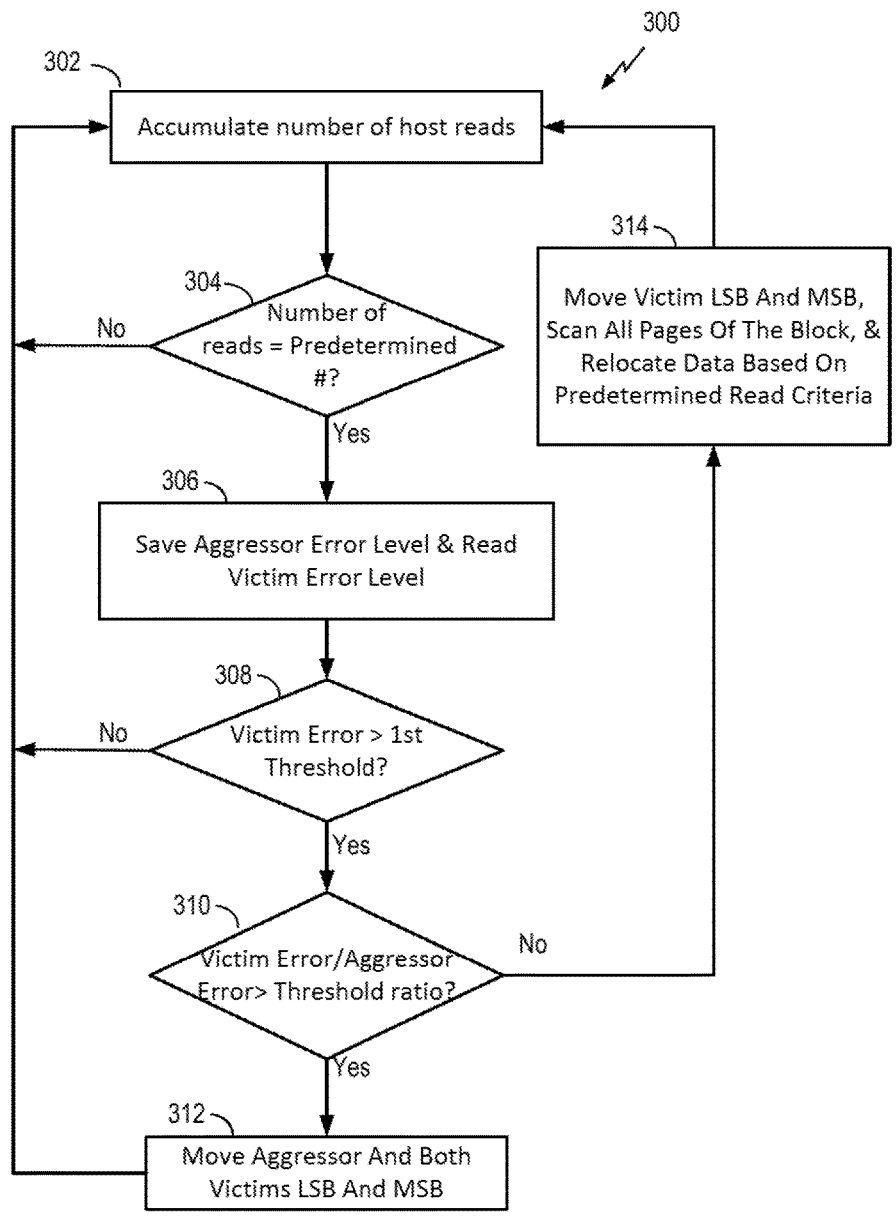
FIG. 3 illustrates a flow diagram of an exemplary Read Disturb detection method in accordance with the present disclosure.

FIG. 3 illustrates a flow diagram of a Read Disturb detection method 300. In particular, the methodology disclosed in FIG. 3 provides an exemplary Read Disturb detection method that includes protection against cases where a particular page may be read or accessed often, such page being termed herein as an "aggressor" page, where the aggressor will induce Read Disturb in pages on adjacent wordlines, which are termed "victims" herein. Method 300 utilizes tracking or accumulation of the number of reads of pages by the host (e.g., host 102) as shown at block 302.

For each predetermined number of host page reads, the error level of an aggressor (i.e., the frequently read page) is compared against the error level of a victim (i.e., a page from an adjacent wordline to the aggressor wordline) as shown at decision block 304. It is noted here that, in aspect, a determination of which pages are aggressor may be based on a priori knowledge of past read history. Of further note, while the affected victim pages are those pages on adjacent wordlines to the wordline of the aggressor page, the meaning of adjacent may be the two pages on wordlines on either side of aggressor page wordline, but may also include more than immediately adjacent such as within a range of pages. For example, in some aspects if the aggressor page is "X" the adjacent victim pages may include those within a "n" number of pages such that the adjacent victim pages encompass X+n and X−n wordlines.

As one example, the predetermined number shown at decision block 304 may be a prime number, such as 4001. The use of a prime number prevents host activity from being able to avoid the algorithm intentionally or unintentionally. For example, some known file systems generally use power of 2 values for their base allocation sizes for files. Accordingly, a prime number prevents the host from reading a location repeatedly without triggering the method. In an aspect, this predetermined number may be selected to be large enough to avoid too frequent determinations of the further steps in method 300, to be discussed below. If the number of host reads has not reached the predetermined number, the flow loops back to block 302 to continue accumulating the host read number until the number reaches the predetermined number condition in block 304. Additionally, it is noted that the method 300 is repeated for each number of reads (e.g., every 4001 host page reads). Thus, an example of coding the process of block 304 may be a modulo operation such that an affirmative meeting of the condition occurs every predetermined number of reads (e.g., Is MOD(No. of reads, 4001)=0?).

When the predetermined number of reads has been reached as determined in block 304, flow proceeds to block 306 where the aggressor error level is saved and error level of the victim page is determined. According to an example, the process of 306 may include saving aggressor word line WL MSB bits in error $E_a$, and reading the victim WL MSB to get a number of bits in error $E_v$. According to another example, the error level may be based on the Bit Error Rates (BERs) of the aggressor and victim pages.

The victim error level may be then compared to a first predetermined threshold as shown in block 308. If the error level is not greater than the predetermined threshold, the flow returns to block 302 to then restart determination of the predefined number of host reads. If the victim error level (or ECC error level) is above the threshold, flow proceeds to block 310. In an aspect, if the number of victim bits in error $E_v$ is greater than 150 then the possibility of Read Disturb errors occurring is higher.

At decision block 310, the aggressor error level is then compared against the error level of the victim. In an example, this comparison may be accomplished by determining the ratio of error level of the victim to the error level of the aggressor and comparing the ratio to a predetermined ratio value. In an example, if the number of bits in error for the victim is over twice the number of bits in error of the aggressor (e.g., $E_v/E_a>2$), then the likelihood of Read Disturb is high and a Read Disturb may be determined. In such case, both the LSB and MSB pages of the aggressors WL and the two adjacent victims WL are relocated to a new block as indicated by block 312, after which flow returns to block 302. It is noted, however, that the methodology is not limited to a two bit per cell construction (e.g., MLC NAND with LSB and MSB), but may be applied in other NVM constructions such a 1 bit per cell, 3 bits per cell, etc. Also, while process 312 is described to include relocation of adjacent victim wordlines, in other aspect it only a single page on one of the adjacent wordlines could be moved in alternative types of NVMs, such as 1 bit per cell NVM constructions.

On the other hand, if the error level of victim page is greater than the first threshold as determined in block 308, but the ratio of the victim error level to the aggressor level is not above the threshold ratio as determined in block 310, the high level of error of the victim is likely not due to Read Disturb, but instead indicative of a high error block. In such case, the LSB and MSB of the victim page may be relocated and the whole block may be then monitored or scanned for excessive error as done in BGMS when a page being checked exceeds error threshold criteria, for example, and data relocated as appropriate according to predefined criteria as shown in block 314.

As will be appreciated, the data frames with the highest error level are used for Read Disturb detection. According to an aspect, if the aggressor Logical Block Number (LBN) is on an MSB page, then the LBN's error level will be used for Read Disturb detection. All of the four data frames of the victim MSB page may then be read and the highest error level is used for Read Disturb detection. According to another aspect, in a special case where the WL1 is used for the victim when the aggressor is on WL0, for example, then the Read Disturb check is skipped when the aggressor is one of 4 last pages of a Partially Written Block.

According to a further aspect, the criteria for deciding how to handle Read Disturb and block errors may assign levels or "stages" of severity based on the error levels determined for the aggressor and victim pages. In an aspect, the criteria may reference low-density parity-check (LDPC) code stages from 1 to 4, with 1 being the least severe error stage and 4 being the most severe error stage. In a further aspect, the error stages represent levels that correspond to the bit error rates (BERs) of the page being read. Of further note, if the determination is based on an LDPC engine (i.e., a soft decode) and not a BCH engine (i.e., a hard decode, although this is not intended to be a preclusion of BCH use with the present methods and apparatus), the error stages are not correlated to an exact BER, but are an approximation or estimate on the difficulty level of correcting a piece of data. The lower the stage number, the easier the data is to correct, whereas the higher the stage number, the harder the data is to correct, which is generally a sign of a high number of errors. The stages may be set at different thresholds of error correction, causing very little data to be relocated at smaller page numbers, and conversely large amounts of data to be relocated at large stage numbers. In a particular example, a stage 1 level would cause relocation of a single data frame of data (e.g., 4 KB), stage 2 would result in relocation of a whole page, stage 3 would relocate a RAID stripe (e.g., 32 pages of data), and stage 4 would result in relocation of a whole block (and all blocks in the stripe). It is further noted that the thresholds for establishing the stages may vary based on NAND type, NAND maturity, manufacturing, and LDPC engine efficiency/effectiveness.

As an example of the criteria using such stages, an exemplary decision matrix or table 400 is illustrated in FIG. 4. In particular, the table 400 illustrates that the criteria is based on a matrix of the relationship between the aggressor stages and the victim stages to determine what is considered as a Read Disturb event and what specific actions should be taken for the victim and/or aggressor data.

As may be seen in Table 400, if the Aggressor stages are one of 2, 3, or 4, while the Victim stages 1 or 2, then respectively at varying degrees either the aggressor logical block address (LBA), the aggressor PageSet (i.e., the pageset of the original aggressor (LSB or MSB)), or the whole BlockSet is relocated or moved to a different block. On the victim side, the whole WL (i.e., the LSB and MSB pages) is moved at victim stage 3. Finally, as shown in Table 400, when either the aggressor or the victim is in the most severe stage 4, the whole Blockset is moved or relocated to a different block.

Figure 5:
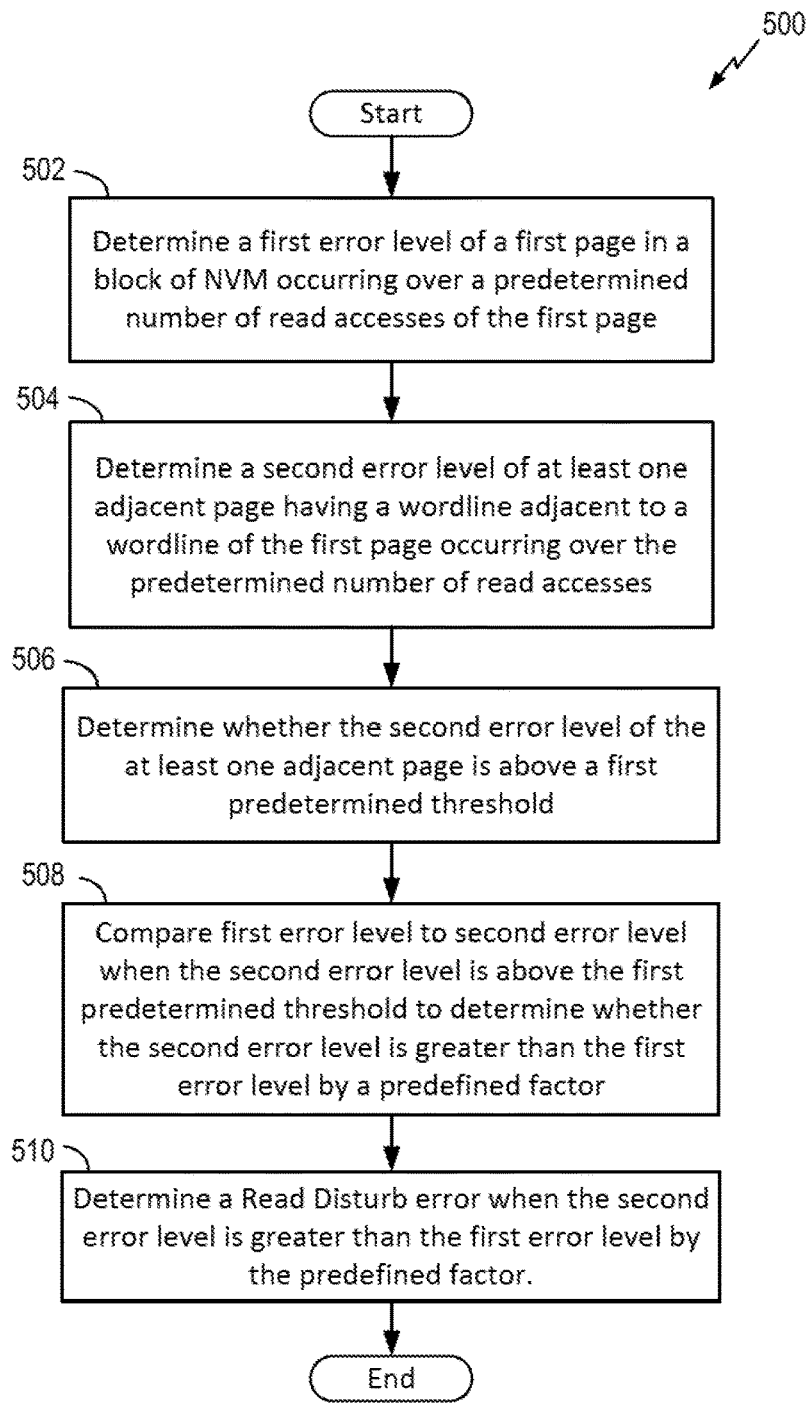
FIG. 5 illustrates a flow diagram of an exemplary method for handling Read Disturb and block errors in accordance with the present disclosure.

FIG. 5 illustrates a further exemplary method 500 for determining Read Disturb errors in an NVM in accordance with the present disclosure. Method 500 provides a process for determining a potential Read Disturb source (i.e., an aggressor) through determining or obtaining the error level at least an adjacent page to potential Read Disturb source. As discussed above, by directly reading the surrounding "potential victims," an error count or level for the victims can be obtained, and if this error level is high enough, a Read Disturb can be established such that relocation is then initiated to mitigate the Read Disturb effects. Furthermore, the relocation may be perform only on those pages that are affected (i.e., the pages having an error level high enough to exceed a predetermined threshold of error, which include the aggressor page and one or more adjacent pages).

As illustrated in FIG. 5, method 500 includes determining a first error level or error measure of a first page in a block of the NVM that occur over a predetermined number of read accesses by a host as shown in block 502. In certain aspects, the determination of block 502 may be effectuated with the controller 108, or with the controller 108 in combination with the host 102 as illustrated in FIG. 2. Additionally, the first page may be identified as a potential aggressor or source for Read Disturb errors. Method 500 further includes determining a second error measure or error level of at least one adjacent page having a wordline adjacent to a wordline of the first page occurring over the predetermined number of read accesses of the first page as shown in block 504. In some examples, the determination of block 504 may be performed by the controller 108, or by the controller 108 in combination with the host 102. The at least one adjacent page may be identified as a victim page. It is noted that in an aspect the terms "adjacent page" or "neighboring page" as used herein may be synonymous to the terms "adjacent wordline" or "neighboring wordline." As illustrated in FIG. 2, for example, the page 206 corresponding to WL 8 has adjacent or neighboring pages 208 or 210 corresponding to wordlines WL 7 and WL 9, respectively. Thus, adjacent page 208 represents a physically adjacent wordline to page 206 and WL 8, for example. In other aspects, it is contemplated that in particular types of NVMs, such as 3D NAND technologies as one example, there may be Read Disturb effects that can reach between particular blocks, not just wordlines in a single block. Accordingly, the terms "adjacent page" or "adjacent wordline" in such NAND geometries could also be considered to encompass a meaning where the adjacent page or wordline that is being victimized by Read Disturb effects is a page or wordline in another block where read operations of a page in a particular block will engender Read Disturb effects in a wordline or page in another block due to proximity in a vertical dimension, for example.

After the determination of the second error level in block 504, method 500 include determining whether the second error level is above a first predetermined threshold as shown at block 506. In an aspect, the error level may be expressed in terms of the number of bits in error or the ECC error count in the at least one adjacent page. In such case, the predetermined threshold is a particular number of bit errors or ECC error count. In a particular example, this error count could be set at 150, as determined from empirical evidence to represent a number of errors that shows a likelihood of Read Disturb error occurring in a page, but this number is not limited to such. Furthermore, the process in block 506 may be performed by the controller 108, or by the controller 108 in combination with the host 102.

Method 500 also includes comparing the first error level to the second error level when the second error level is above the first predetermined threshold to determine whether the second error level is greater than the first error level by a predefined factor as shown in block 508. In an aspect, the process of block 508 is a determination of whether the amount of errors in a victim page are sufficiently high enough in comparison to the adjacent aggressor page to warrant a determination of a Read Disturb situation occurring as illustrated in block 510. That is, if the victim page shows a relatively greater level of error compared to errors occurring in the aggressor page, then it is more likely that the reading of the aggressor page is causing the error in the adjacent victim page through the Read Disturb effect as opposed to simply the existence of a high error level in the block as a whole. One example of the process of block 508 may be seen in block 310 of FIG. 3 where a ratio of the error of the victim to the aggressor is determined, such as twice the level of error in an example. The processes in blocks 508 and 510 may be performed by the controller 108, or by the controller 108 in combination with the host 102.

In other aspects, the method 500 may further include relocating the first page and the at least one adjacent page within the NVM after establishing the Read Disturb error, such as was illustrated in block 312 of method 300. Additionally, the methodology may also include establishing a determination of a high error block of the block of the NVM when the second error level is not greater than the first error level by the predefined factor. An example of this process may be seen in block 310 of method 300. Also, based on the determination of a high error block, the method 500 may include relocating the at least one adjacent page within the NVM after establishing a high error block. An example of this process may be seen in block 314 of FIG. 3. Also, when relocating pages in the method of FIG. 5, more particularly a most significant bit (MSB) and a least significant bit (LSB) address of the at least one adjacent page may be moved within the NVM after establishing either Read Disturb or the high error block determinations. Examples of the MSB and LSB relocation are described in connection with blocks 312 and 314.

In still further aspects, the method 500 may include determining a plurality of stages for the first page and the at least one adjacent page based on the determined first and second errors, as was described previously in connection with FIG. 4. In particular, each of the plurality of stages is a level of severity of the error occurring in a page such as Aggressor stages 1-4 and Victim stages 1-4 illustrated in FIG. 4. In accordance with assigning of stages to the errors, the relocation may be based on the determined stages include relocating a logical block address of the first page (e.g., the relocations for Aggressor Stage 2 status), a physical location of the first page and the at least one adjacent page within the NVM (e.g., the relocations for victim stage 3 and aggressor stages 1-3), and a whole block in which the first page and the at least one adjacent page (e.g., victim stage 4 and aggressor stage 4). Still further, the method 500 may include maintaining the locations of the first page and the at least one adjacent page when the stage levels of the first page and the least one adjacent page are of values indicating a low level of severity of the error in the pages (e.g., aggressor stage 1 and victim stages 1 and 2).

According to another aspect, a memory device including an apparatus for handling Read Disturb and block errors in a non-volatile memory (NVM) is contemplated, the apparatus including means for determining whether a number of read accesses of a page in the NVM has reached a predefined value. As an example, this means for determining if the read accesses reaches the predefined value may be implemented by structure such as controller 108 or controller 108 in combination with one or more of memory 110, NVM 114, and host 102, and equivalents thereof such as logic circuitry or a dedicated processor. The apparatus further includes means for obtaining an error measure for the page after the number of read accesses has reached the predefined value. This means for obtaining the error measure for the page may be implemented by structure such as controller 108 or controller 108 in combination with one or more of memory 110, NVM 114, and host 102, and equivalents thereof such as logic circuitry or a dedicated processor.

The apparatus may yet further include means for obtaining an error measure for at least one neighboring page that is on an adjacent wordline to the page within the NVM. This means for obtaining the error measure for the at least one neighboring page may be implemented by structure such as controller 108 or controller 108 in combination with one or more of memory 110, NVM 114, and host 102, and equivalents thereof such as logic circuitry or a dedicated processor. Still further, the apparatus may include means for determining if the error measure of the at least one neighboring page is greater than a predefined threshold. This means for determining if the error measure of the at least one neighboring page is greater than a predefined threshold may be implemented by structure such as controller 108 or controller 108 in combination with one or more of memory 110, NVM 114, and host 102, and equivalents thereof such as logic circuitry or a dedicated processor. Finally, apparatus may include means for determining a Read Disturb error of the at least one neighboring page when the error measure of the at least one neighboring page is greater than the error measure of the page by a predefined factor. This means for determining the Read Disturb error may be implemented by structure such as controller 108 or controller 108 in combination with one or more of memory 110, NVM 114, and host 102, and equivalents thereof such as logic circuitry or a dedicated processor.

As will be appreciated by those skilled in the art, the present disclosed methods and apparatus provide reading of the actual potentially affected pages of Read Disturb by going through the entire error-handling process to determine how severe the error is to more accurately determine if the page is in fact a victim of read disturb errors.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

What is claimed is:

1. A method for use with a non-volatile memory (NVM), the method comprising:
   determining a first error level of a first page in a block of the NVM and a second error level of at least one adjacent page having a wordline adjacent to a wordline of the first page occurring over a predetermined number of read accesses of the first page;
   determining whether the second error level of the at least one adjacent page is above a first predetermined threshold;
   comparing the first error level to the second error level when the second error level is above the first predetermined threshold to determine whether the second error level is greater than the first error level by a predefined factor; and
   relocating at least one page within the NVM when the second error level is determined to be greater than the first error level by the predefined factor.

2. The method of claim 1, wherein the second error level is due, at least in part, to Read Disturb errors, and wherein relocating the at least one page comprises relocating the first page and the at least one adjacent page.

3. The method of claim 2, further comprising:
   establishing a determination of a high error block of the block of the NVM when the second error level is not greater than the first error level by the predefined factor.

4. The method of claim 3, further comprising:
   relocating the at least one adjacent page within the NVM after establishing the high error block.

5. The method of claim 3, further comprising:
   relocating a most significant bit (MSB) and a least significant bit (LSB) address of the at least one adjacent page within the NVM after establishing a high error block.

6. The method of claim 2, further comprising:
   determining a plurality of stages for the first page and the at least one adjacent page based on the determined first and second errors, wherein each of the plurality of stages is a level of severity of the error occurring in a page; and
   relocating at least one of a logical block address of the first page, a physical location of the first page and the at least one adjacent page within the NVM, and a block in which the first page and the at least one adjacent page are located based on the stage of the first page and the stage of the at least one adjacent page.

7. The method of claim 6, further comprising:
   maintaining the locations of the first page and the at least one adjacent page when the stage levels of the first page and the least one adjacent page are of values indicating a low level of severity of the error in the pages.

8. The method of claim 6, wherein the plurality of stages are based on low density parity check (LDPC) decode stages.

9. The method of claim 1, wherein the NVM comprises NAND-type flash memory.

10. A solid state drive (SSD) comprising:
    a non-volatile memory (NVM); and
    a controller communicatively coupled to a host device and the NVM,
    wherein the controller is configured to:
    determine an error level of an aggressor page in the NVM;
    determine an error level of a victim page adjacent to the aggressor page within a block of the NVM;
    determine whether the error level of the victim page is greater than a first predetermined threshold;
    compare the error level of the aggressor page to the error level of the victim page when the error level of the victim is greater than the first predetermined threshold; and
    move at least one of the aggressor page and the victim page when the comparison of the error levels of the aggressor and victim pages indicates that victim level error is greater than the first error level by a predefined factor.

11. The solid state drive of claim 10, wherein the error level of the victim page is due, at least in part, to Read Disturb errors, and the controller is further configured to:
    move the aggressor page and the victim page within the NVM after determining the Read Disturb error.

12. The solid state drive of claim 11, wherein the controller is further configured to move another victim page within the NVM, where the victim page has a wordline number immediately previous to a wordline number of the aggressor page and the another victim page has a wordline number immediately after the wordline number of the aggressor page.

13. The solid state drive of claim 11, wherein the error level is one of an Error-correcting code (ECC) value and a bit error rate (BER) of a page.

14. The solid state drive of claim 10, wherein the controller is further configured to establish a determination of a high error block of the block of the NVM when the error level of the victim block is above the first predetermined threshold but is not greater than the error level of the aggressor block by the predefined factor.

15. The solid state drive of claim 14, wherein the controller is further configured to move a least significant bit (LSB) address and a most significant bit address (MSB) of the victim page within the NVM after determining the high error block.

16. The solid state drive of claim 10, wherein the controller is further configured to:
    assign one of a plurality of error stage values for each of the victim and aggressor pages based on the determined error levels of the victim and aggressor pages, wherein each of the plurality of error stages values represent a level of severity of the error occurring in a page; and
    move at least one of a logical block address of the aggressor page, a physical location of the aggressor page and the victim page within the NVM, and an entire block in which the aggressor page and the victim page are located based on the stage of the aggressor page and the stage of the victim page.

17. The solid state drive of claim 16, wherein the controller is further configured to: maintain the locations of the aggressor and victim pages within the block when the stage levels of the aggressor and victim pages are of values indicating a low level of severity of the error in the pages.

18. The solid state drive of claim 16, wherein the plurality of error stage values are based on low density parity check (LDPC) decode stages.

19. A memory device for use with a non-volatile memory (NVM), the apparatus comprising:
    means for determining whether a number of read accesses of a page in the NVM has reached a predefined value;
    means for obtaining an error measure for the page after the number of read accesses has reached the predefined value;

means for obtaining an error measure for at least one neighboring page that is on an adjacent wordline to the page within the NVM;

means for determining if the error measure of the at least one neighboring page is greater than a predefined threshold;

means for relocating the page and the at least one neighboring page when the error measure of the at least one neighboring page is determined to be greater than the error measure of the page by a predefined factor.

20. The memory device of claim 19, wherein the error measure for the at least one neighboring page is due, at least in part, to a Read Disturb error.

21. The memory device of claim 19, further comprising:
means for determining a high block error state for a block containing the page and the at least one neighboring page by determining that the error measure of the at least one neighboring page is greater than the predefined value and is not greater than or equal to the error measure of the page by the predefined factor.

22. The memory device of claim 19, further comprising:
means for relocating the at least one neighboring page when a high block state is determined.

23. The memory device of claim 19, wherein the error measure is one of an Error-correcting code (ECC) value and a bit error rate (BER) of a page.

* * * * *